United States Patent
Su

(10) Patent No.: US 7,262,815 B2
(45) Date of Patent: Aug. 28, 2007

(54) HARMONIC MIXER BASED TELEVISION TUNER AND METHOD OF PROCESSING A RECEIVED RF SIGNAL

(75) Inventor: Tung-Ming Su, Kao-Hsiung Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 383 days.

(21) Appl. No.: 10/707,319

(22) Filed: Dec. 4, 2003

(65) Prior Publication Data
US 2004/0257478 A1    Dec. 23, 2004

Related U.S. Application Data

(63) Continuation-in-part of application No. 10/604,018, filed on Jun. 22, 2003, now Pat. No. 6,999,747.

(51) Int. Cl.
*H04N 5/50* (2006.01)
(52) U.S. Cl. .................................. 348/731; 455/189.1
(58) Field of Classification Search ............. 348/731, 348/725, 726; 455/311–319, 324, 189.1
See application file for complete search history.

(56) References Cited

U.S. PATENT DOCUMENTS

| 4,320,536 | A | * | 3/1982 | Dietrich ...................... 455/325 |
|---|---|---|---|---|
| 4,581,643 | A | | 4/1986 | Carlson |
| 5,325,129 | A | * | 6/1994 | Henry et al. ................ 348/571 |
| 5,517,687 | A | * | 5/1996 | Niehenke et al. ........... 455/325 |
| 5,589,791 | A | | 12/1996 | Gilbert |
| 5,737,035 | A | * | 4/1998 | Rotzoll ....................... 348/725 |
| 5,742,357 | A | | 4/1998 | Griesbaum |
| 5,802,447 | A | | 9/1998 | Miyazaki |
| 5,826,182 | A | | 10/1998 | Gilbert |
| 5,847,612 | A | * | 12/1998 | Birleson ........................ 331/2 |
| 5,950,112 | A | | 9/1999 | Hori et al. |
| 6,028,493 | A | | 2/2000 | Olgaard et al. |
| 6,029,059 | A | | 2/2000 | Bojer |
| 6,091,303 | A | | 7/2000 | Dent |
| 6,122,497 | A | | 9/2000 | Gilbert |
| 6,127,962 | A | * | 10/2000 | Martinson .................... 342/20 |

(Continued)

FOREIGN PATENT DOCUMENTS

CN      1347203 A      5/2002

(Continued)

*Primary Examiner*—Paulos Natnael
(74) *Attorney, Agent, or Firm*—Winston Hsu

(57) ABSTRACT

A first local oscillator operating at a first frequency provides a first reference signal and a second reference signal. The second reference signal is the first reference signal phase shifted by 90 degrees. A first harmonic mixer has inputs coupled to a received RF signal, the first reference signal, and the second reference signal. A band-pass filter is coupled to an output of the first harmonic mixer. A second local oscillator operates at a second frequency and provides a third, a fourth, a fifth, and a sixth reference signal, which are phase shifted by 0 degrees, 45 degrees, 90 degrees, and 135 degrees, respectively. A second harmonic mixer has inputs coupled to an output of the band-pass filter, the third reference signal, and the fifth reference signal. A third harmonic mixer has inputs coupled to the output of the band-pass filter, the fourth reference signal, and the sixth reference signal.

21 Claims, 2 Drawing Sheets

U.S. PATENT DOCUMENTS

| | | |
|---|---|---|
| 6,177,964 B1 | 1/2001 | Birleson et al. |
| 6,243,569 B1 | 6/2001 | Atkinson |
| 6,307,894 B2 | 10/2001 | Eidson et al. |
| 6,370,372 B1 | 4/2002 | Molnar et al. |
| 6,400,416 B1 | 6/2002 | Tomasz |
| 6,480,236 B1 | 11/2002 | Limberg |
| 6,496,229 B1 | 12/2002 | Limberg |
| 6,724,440 B1 | 4/2004 | Suan et al. |
| 6,724,441 B2 | 4/2004 | Choi |
| 6,725,463 B1 | 4/2004 | Birleson |
| 6,807,405 B1 | 10/2004 | Jagger et al. |
| 6,888,580 B2 | 5/2005 | Dujmenovic |
| 6,934,523 B2 | 8/2005 | Yasuda |
| 6,995,808 B2 | 2/2006 | Kovacic et al. |
| 6,999,747 B2 * | 2/2006 | Su .............. 455/324 |
| 7,006,162 B2 | 2/2006 | Cowley et al. |
| 7,019,598 B2 | 3/2006 | Duncan et al. |
| 7,019,790 B2 | 3/2006 | Yamamoto |
| 2002/0054651 A1 | 5/2002 | Posti |
| 2005/0235333 A1 * | 10/2005 | Bertonis et al. ............ 725/111 |

FOREIGN PATENT DOCUMENTS

| | | |
|---|---|---|
| CN | 1359589 A | 7/2002 |
| KR | 2002030379 A | 4/2002 |

* cited by examiner

HARMONIC MIXER BASED TELEVISION TUNER AND METHOD OF PROCESSING A RECEIVED RF SIGNAL

CROSS REFERENCE TO RELATED APPLICATIONS

This is a continuation-in-part of application Ser. No. 10/604,018, filed on Jun. 22, 2003, now U.S. Pat. No. 6,999,747 entitled "Passive Harmonic Mixer" and assigned to the same assignee, the contents of which are incorporated herein by reference.

BACKGROUND OF INVENTION

1. Field of the Invention

The invention relates to television tuners, and more particularly, to a double conversion television tuner using a harmonic mixer architecture with no second intermediate frequency to process a received RF signal.

2. Description of the Prior Art

One of the most significant costs in television manufacturing is the cost of the tuner. The typical cost of a television (TV) tuner is in the neighborhood of $15.00, which, relative to the cost of the entire television set, is very substantial. Furthermore, with the increasing desire to integrate TV functions into personal computer (PC) systems and other electronic devices, the cost of the tuner needs to be reduced. Part of the solution to reducing tuner cost is to reduce the number of components in the tuner.

Traditionally, tuners have been comprised of two basic components. The first component performs high frequency to intermediate frequency (RF to IF) conversion. Subsequently, the second component performs IF to baseband conversion. The TV tuner was originally designed for broadcast television reception within a television set, which is essentially a stand-alone unit containing a cathode ray picture tube. As such, TV tuners were originally integral parts embedded in a single-purpose device.

Presently, however, state-of-the-art consumer electronic devices use TV tuners that are not a built-in part of a television set. The tuner is a separate element that is connected to a cathode ray picture tube at some point, but the tuner is not an integral part of the monitor. As previously mentioned, TV tuners may be fabricated on circuit boards and then installed in personal computer systems, thereby allowing the PC to function as a television set. These tuners convert a radio frequency television signal into a baseband (or low frequency) video signal, which can then be passed on to other elements in the PC for video processing applications.

The circuit component that performs the RF-to-IF conversion typically comprises one or two integrated circuits and numerous discrete elements such as inductors, capacitors and/or transistors. The IF-to-baseband conversion typically includes another integrated circuit, several filter elements, such as ceramic filters and SAW filters, a series of tuning and control elements, such as resistors and potentiometers, variable inductors and/or capacitors, and some other additional external components. Thus, the complexity of the tuner is fairly high and typically there may be between 100 and 200 elements on a circuit board. Furthermore, state-of-the-art TV tuners still require that each tuner be aligned by manual tuning before leaving the factory. This manual tuning is one of the most expensive costs associated with the manufacturing process and an important factor in the cost of tuners.

Broadcast television tuners of the past have gone through an evolution over a period of more than 60 years. The earliest tuners utilized vacuum tube technology and required that the minimum number of vacuum tubes possible be used due to their cost, power consumption and dimensions. Therefore, passive components, such as resistors, capacitors, inductors and transformers, were used as much as possible in most designs. This style of design continued until about 1960 when TV tuner components, particularly vacuum tubes began to be replaced by bipolar and MOS transistors. However; the active device count still defined the cost and size limits of TV tuners and active device count minimization continued.

In the early 1970's the integrated circuit became viable as an element in the television tuner and the design techniques were dramatically changed. Many functions of the tuner utilizing only one tube or transistor were being replaced with 4 to 20 individual transistors which could perform the same function with better precision, less space, less power, less heat generation, and lower cost. The introduction of the integrated circuit was gradual, first encompassing only low frequency elements and then eventually high frequency active elements. Nonetheless, many passive elements external to the integrated circuits remained in TV tuner designs.

One advance, the SAW (surface acoustic wave) filters made a significant change in that several manually tuned inductors and capacitors could be removed from the tuners and receive-filtering performance could be improved within a much smaller space and at reduced cost. However, the SAW filter, which is fabricated on a ceramic substrate, cannot be integrated on a silicon wafer with the rest of the active circuitry and must therefore remain a discrete component in the final design. The trend of the 1980's was to miniaturize all of the passive components and simplify their associated manual tuning at the factory. In recent years, TV tuners have been reduced in size from requiring fairly large enclosures, about 2"×5"×1", to much smaller enclosures, about ½"×2"×⅜". There is a high premium placed on small size because TV tuners are being used in smaller and smaller computers, television sets, and VCRs. As the equipment in which tuners are used becomes smaller, the size of the TV tuner must also decrease.

As the size of the tuner is reduced, and as tuners are used in a wider variety of devices, cost becomes more critical and must be reduced as much as possible in order not to represent a large portion of the final product cost. When a tuner is used in a television set, the tuner size is less critical because the television set inherently has a large mass. But when a tuner is used in other electronic equipments, space becomes a premium and the footprint of the tuner becomes critical.

FIG. 1 shows a highly integrated television tuner 100 on a single microcircuit as disclosed by U.S. Pat. No. 5,737,035. The television tuner 100 includes an adjustable low noise amplifier 101, a first mixer 102, a first local oscillator 104, a band-pass filter 106, a second mixer 108, being an image rejection type mixer, a second local oscillator 110, a first intermediate frequency amplifier 112, a second band-pass filter 114, and a variable intermediate frequency amplifier 116. However, as the television tuner 100 requires the use of a special image rejection mixer for the second mixer 108, the cost of the tuner is increased. Additionally, the first local oscillator 104 is used in conjunction with the first mixer 102 to up-convert a particular channel selected from an incoming RF signal. This means the first local oscillator 104 must be a variable frequency local oscillator having a large operating frequency range. Because the phase noise over the operating frequency range of the first local oscillator 104 must meet a specific phase noise requirement, typically 84 dBC/Hz, a plurality of VCOs having smaller frequency ranges, and therefore lower phase noise, must be used. This again increases the complexity and cost of the television tuner 100. Accordingly, a need exists for a tuner not having these requirements in order to reduce the cost.

SUMMARY OF INVENTION

It is therefore a primary objective of the claimed invention to provide a double conversion television tuner using a harmonic mixer architecture with no second intermediate frequency, to solve the above-mentioned problems and reduce the overall cost.

According to the claimed invention, a television tuner is disclosed comprising a first mixer having inputs coupled to a received RF signal for converting the received RF signal to a intermediate frequency signal, a band-pass filter coupled to the first harmonic mixer, a second harmonic mixer coupled to the band-pass filter for directly converting the intermediate frequency signal to an in-phase baseband signal, and a third harmonic mixer coupled to the band-pass filter for directly converting the intermediate frequency signal to a quadrature-phase baseband signal.

Also according to the claimed invention, a method of processing a received RF signal. The method comprising mixing the received RF signal to produce an intermediate frequency signal, filtering the intermediate frequency signal to produce a pass band signal, mixing the pass band signal to produce a in-phase baseband signal, and mixing the pass band signal to produce a quadrature-phase baseband signal.

These and other objectives of the claimed invention will no doubt become obvious to those of ordinary skill in the art after reading the following detailed description of the preferred embodiment that is illustrated in the various figures and drawings.

DETAILED DESCRIPTION

Figure 2:
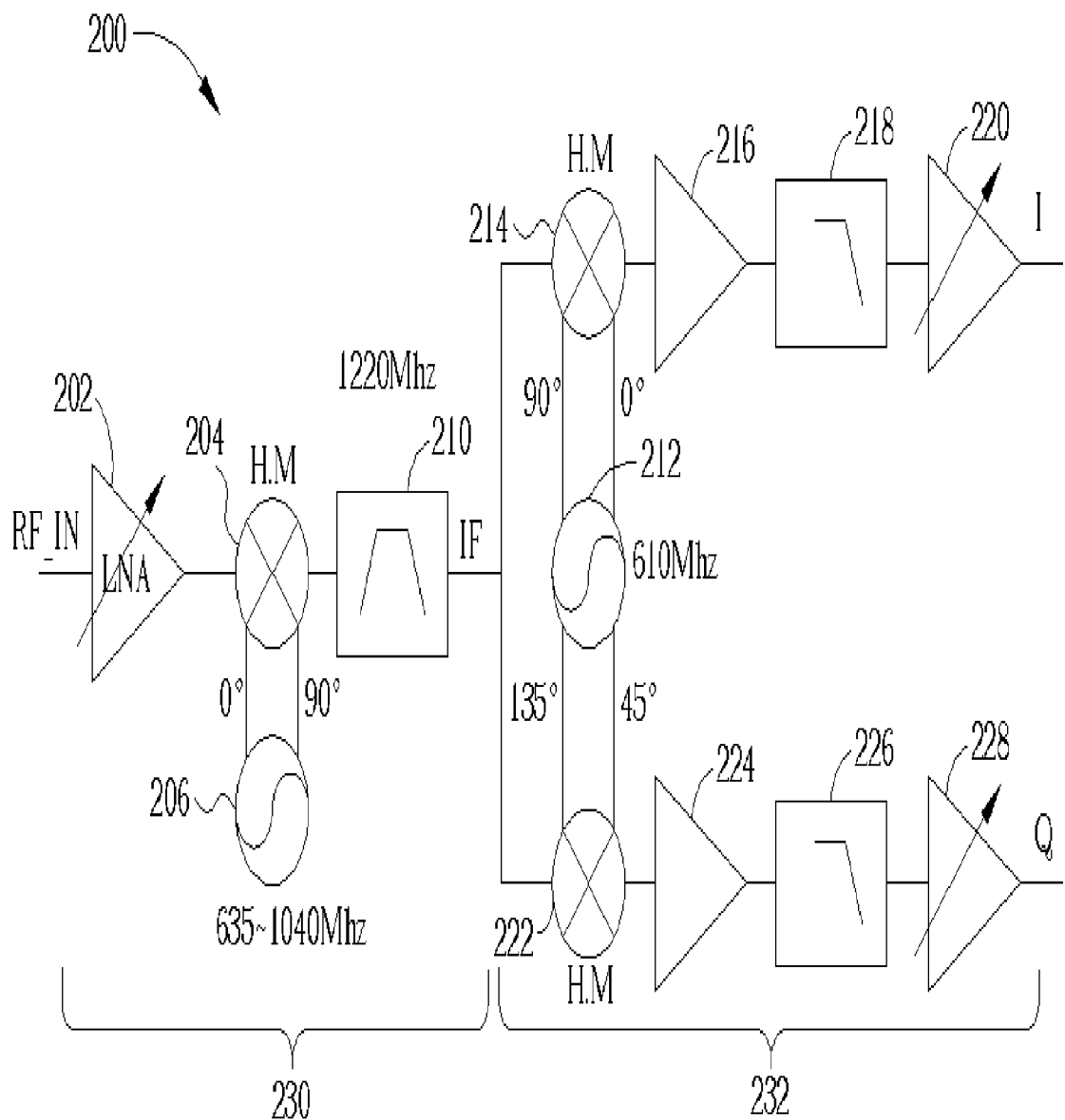
FIG. 2 is a double conversion television tuner architecture according to the present invention.

FIG. 2 shows a double conversion television tuner 200 architecture according to an embodiment of the present invention. The television tuner 200 includes a low noise amplifier 202, a first harmonic mixer 204, a first local oscillator 206, a band-pass filter 210, a second local oscillator 212, a second harmonic mixer 214, a first in-phase baseband amplifier 216, an in-phase low-pass filter 218, a second in-phase baseband amplifier 220, a third harmonic mixer 222, a first quadrature baseband amplifier 224, a quadrature low-pass filter 226, and a second quadrature baseband amplifier 228.

A received radio frequency signal (RF_IN) is amplified by the low noise amplifier 202 and coupled to an input of the first harmonic mixer 204. The harmonic mixer 204 is used in the embodiment of the present invention, however, other kinds of mixers can also be used here. The structure and the operation of the harmonic mixer are disclosed in the co-pending application entitled "Passive Harmonic Mixer", Ser. No. 10/604018, filed on Jun. 22, 2003 and assigned to the same assignee, the contents of which are incorporated herein by reference. The first local oscillator 206 operates at a variable first frequency and provides both a 0° phase-delayed reference signal and a 90° phase-delayed reference signal. The output of the first harmonic mixer 204 has a desired channel in the received RF signal positioned at 1220 MHz or 1090 Mhz, according to the center frequency of the bandwidth of the bandpass filter 210. The output of the band pass filter 210 is coupled to the inputs of both the second harmonic mixer 214 and the third harmonic mixer 222. The second local oscillator 212 operates at a constant second frequency of 610 MHz (1220 Mhz input) or 545 Mhz (1090 Mhz input) and provides a 0° phase-delayed reference signal, a 45° phase-delayed reference signal, a 90° phase-delayed reference signal, and a 135° phase-delayed reference signal. The output of the second harmonic mixer 214 is an in-phase baseband signal, and the output of the third harmonic mixer 222 is a quadrature baseband signal. The first in-phase baseband amplifier 216, the in-phase low-pass filter 218, and the second in-phase baseband amplifier 220 filter and amplify the in-phase baseband signal for processing in later stages in the TV receiver. Likewise, the first quadrature baseband amplifier 224, the quadrature low-pass filter 226, and the second quadrature baseband amplifier 228 filter and amplify the quadrature baseband signal for processing in later stages in the TV receiver. Together, the output of the second in-phase amplifier I and the output of the second quadrature amplifier Q form a baseband video signal, which is then passed on to other video processing elements.

Figure 1:
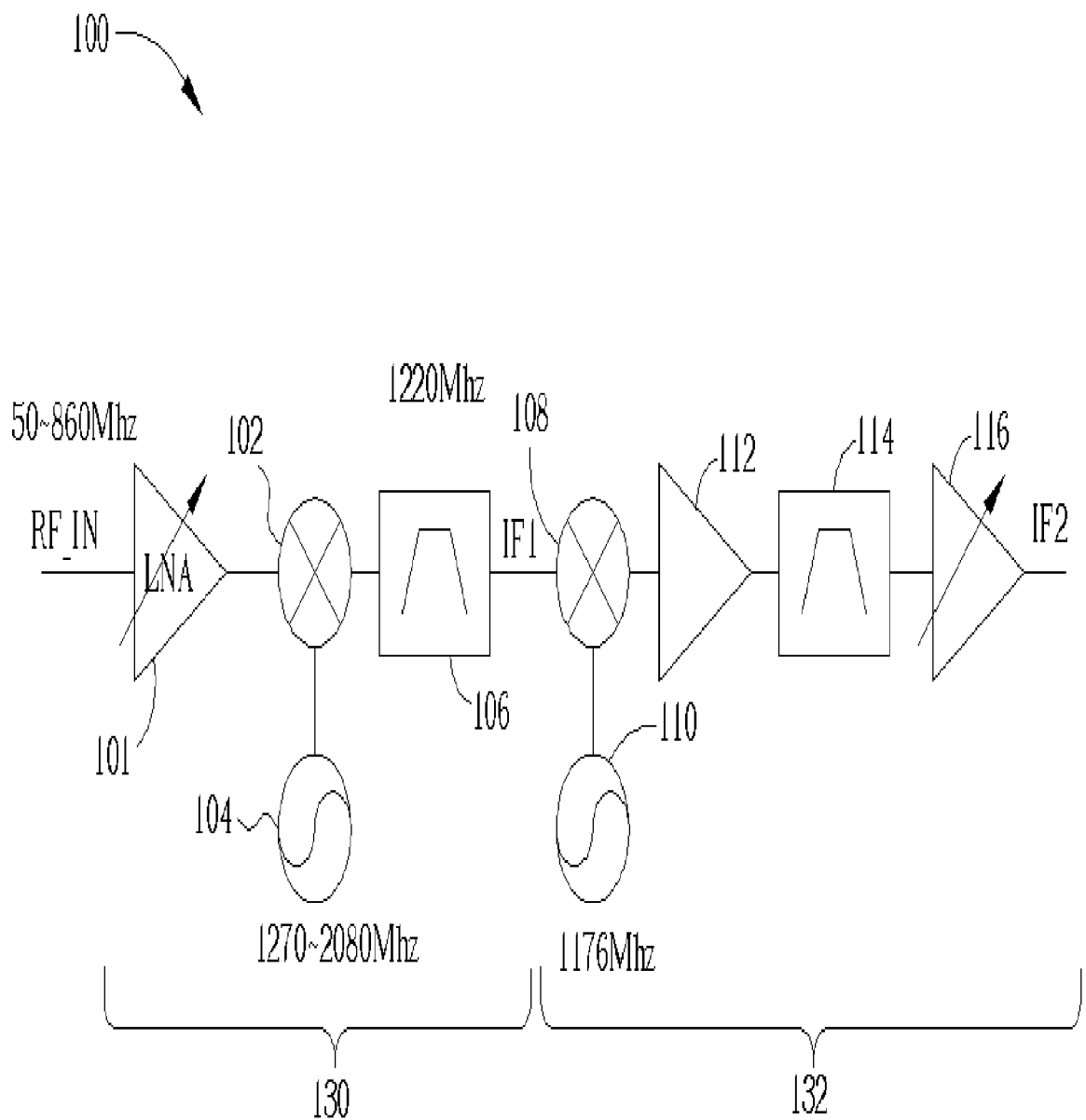
FIG. 1 is a highly integrated television tuner according to the prior art.

Because a harmonic architecture is used, the frequency range of the 0° phase-delayed reference signal and the 90° phase-delayed reference signal output by the first local oscillator 206 is between 635 MHz and 1040 MHz (when a SAW filter 210 having a center frequency of the bandwidth, 1220 Mhz, is used). This is one half the frequency range of the conventional TV tuner shown in FIG. 1 and means that the VCO architecture implementing the first local oscillator 206 of the present invention is greatly simplified. The same specific phase noise requirement, typically 84 dBC/Hz, can be met by using approximately half the number of VCOs that are required in the conventional TV tuner. This both simplifies the design of the television tuner and significantly reduces the cost of the television tuner 200 implementation.

The second stage of the television tuner 200 forms a direct conversion receiver (DCR). The intermediate frequency signal output by the band-pass filter 210 is directly converted to baseband. The direct conversion architecture includes an In-phase (I) pathway and a Quadrature-phase (Q) pathway for directly converting the intermediate frequency signal to a baseband signal. Since the direct conversion architecture is used, there is no second intermediate frequency. In addition, in this embodiment of the present invention, two harmonic mixers are used. One in the In-phase (I) pathway and one in the Quadrature-phase (Q) pathway. Thus, the second local oscillator 212 operates at a constant 610 MHz (when a SAW filter 210 having a center frequency of the bandwidth, 1220 Mhz, is used), one half the frequency of the second local oscillator 108 of the FIG. 1. As such, the additional frequency conversion stage required in the conventional television tuner to convert the output IF2_OUT to baseband is not required. Furthermore, the in-phase low-pass filter 218 and the quadrature low-pass filter 226 are simple low-pass filters that can be fabricated internal to an integrated circuit (IC). The conventional TV tuner shown in FIG. 1 uses the bandpass filter 114, which has image rejection functions and is normally fabricated off-chip. By using a direct conversion architecture with harmonic mixer implementation according to the present invention, the complexity and cost of the television tuner 200 is greatly reduced.

The present invention uses a direct conversion architecture with harmonic mixer architecture to convert a received RF signal to baseband using only a single intermediate frequency. In this way, the operating frequency range of the variable local oscillator is reduced by one half. This reduces the number of VCOs that must be used to ensure the phase noise of the first local oscillator meets the required phase noise levels. Additionally, by using the direct conversion architecture, the in-phase low-pass filter 218 and the quadrature low-pass filter 226 can be implemented on-chip, and the output of the second and the third harmonic mixers is the baseband video signal. The baseband video signal can then be directly passed on to other video processing elements avoiding the use the second intermediate frequency to baseband conversion required in the conventional TV tuner.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A television tuner comprising:
a first mixer coupled to a received RF signal for converting the received RF signal to an intermediate frequency signal according to an oscillating signal;
a band-pass filter coupled to the first mixer for filtering the intermediate frequency signal and thereby generating a filtered intermediate frequency signal;
a first local oscillator operating at a first frequency and providing the oscillating signal to the first mixer, the first frequency is determined by the band-pass filter;
a second mixer coupled to the band-pass filter for converting the filtered intermediate frequency signal to an in-phase baseband signal; and
a third mixer coupled to the band-pass filter for converting the filtered intermediate frequency signal to a quadrature-phase baseband signal;
wherein at least one of the first mixer, the second mixer and the third mixer is a harmonic mixer.

2. The television tuner of claim 1, wherein the first mixer is a harmonic mixer.

3. The television tuner of claim 1, wherein the first frequency is variable and determined by the frequency of the received RF signal.

4. The television tuner of claim 1, wherein the frequency of the intermediate frequency signal is centered at the center frequency of the bandwidth of the band-pass filter.

5. The television tuner of claim 1, wherein the second mixer and the third mixer are harmonic mixers.

6. The television tuner of claim 5, further comprising a second local oscillator operating at a second frequency and providing a third reference signal, a fourth reference signal, a fifth reference signal, and a sixth reference signal, the fourth reference signal being the third reference signal phase shifted by 45 degrees, the fifth reference signal being the third reference signal phase shifted by 90 degrees, and the sixth reference signal being the third reference signal phase shifted by 135 degrees; the second mixer having inputs coupled to the third reference signal and the fifth reference signal, and the third mixer having inputs coupled to the fourth reference signal and the sixth reference signal.

7. The television tuner of claim 6, wherein the second frequency is determined by the output of the band-pass filter.

8. The television tuner of claim 6, wherein the second frequency is fixed.

9. The television tuner of claim 2, wherein the oscillating signal comprises a first reference signal and a second reference signal, the second reference signal is the first reference signal phase shifted by 90 degrees.

10. A method of processing a received RF signal, the method comprising:
mixing the received RF signal to produce an intermediate frequency signal, the received RF signal being mixed harmonically with a first reference signal and a second reference signal having a first frequency, the second reference signal being the first reference signal phase shifted by 90 degrees;
varying the first frequency according to the frequency of the received RF signal;
filtering the intermediate frequency signal to produce a pass band signal;
mixing the pass band signal to produce an in-phase baseband signal; and
mixing the pass band signal to produce a quadrature-phase baseband signal.

11. The method of claim 10, wherein the frequency of the intermediate frequency signal is fixed.

12. The method of claim 10, wherein the pass band signal is mixed harmonically with a third reference signal and a fifth reference signal to generate the in-phase baseband signal and the pass band signal is mixed harmonically with a fourth reference signal and a sixth reference signal to generate the quadrature-phase baseband signal, wherein the third reference signal, the fourth reference signal, the fifth reference signal, and the sixth reference signal are all have a second frequency, the fourth reference signal being the third reference signal phase shifted by 45 degrees, the fifth reference signal being the third reference signal phase shifted by 90 degrees, and the sixth reference signal being the third reference signal phase shifted by 135 degrees.

13. The method of claim 12, wherein the second frequency is determined by the frequency of the pass band signal.

14. The method of claim 13, wherein the second frequency is fixed.

15. A television tuner comprising:
a first mixer coupled to a received RF signal for converting the received RF signal to an intermediate frequency signal according to a first reference signal and a second reference signal, the second reference signal being the first reference signal phase shifted by 90 degrees;
a band-pass filter coupled to the first mixer for filtering the intermediate frequency signal and thereby generating a filtered intermediate frequency signal;
a second mixer coupled to the band-pass filter for converting the filtered intermediate frequency signal to an in-phase baseband signal; and
a third mixer coupled to the band-pass filter for converting the filtered intermediate frequency signal to a quadrature-phase baseband signal;
wherein the frequency of the intermediate frequency signal is centered at the center frequency of the bandwidth of the band-pass filter.

16. The television tuner of claim 15, wherein at least one of the first mixer, the second mixer and the third mixer is a harmonic mixer.

17. A television tuner comprising:
a first mixer coupled to a received RF signal for converting the received RF signal to an intermediate frequency signal according to an oscillating signal;
a first local oscillator for providing the oscillating signal to the first mixer;
a band-pass filter coupled to the first mixer for filtering the intermediate frequency signal and thereby generating a filtered intermediate frequency signal; and
a mixing unit coupled to the band-pass filter for converting the filtered intermediate frequency signal to a baseband signal;
wherein the frequency range of the oscillating signal is narrower than the frequency range of the received RF signal;
wherein the mixing unit comprises:
   a second mixer coupled to the band-pass filter for converting the filtered intermediate frequency signal to an in-phase baseband signal; and
   a third mixer coupled to the band-pass filter for converting the filtered intermediate frequency signal to a quadrature-phase baseband signal.

18. The television tuner of claim 17, wherein at least one of the first mixer, the second mixer and the third mixer is a harmonic mixer.

19. The television tuner of claim 17, wherein the frequency of the oscillating signal is lower than the frequency of the filtered intermediate frequency signal.

20. The television tuner of claim 17, wherein the frequency range of the received RF signal is a multiple of the frequency range of the oscillating signal.

21. The television tuner of claim 20, wherein the frequency range of the oscillating signal is one half of the frequency range of the received RF signal.

* * * * *